US010840940B2

United States Patent
YiN et al.

(10) Patent No.: US 10,840,940 B2
(45) Date of Patent: Nov. 17, 2020

(54) SUPPRESSION OF NOISE OF DELTA-SIGMA MODULATORS

(71) Applicant: Cirrus Logic International Semiconductor Ltd., Edinburgh (GB)

(72) Inventors: Leyi YiN, Austin, TX (US); John L. Melanson, Austin, TX (US); Wai-Shun Shum, Austin, TX (US); Xiaofan Fei, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/706,035

(22) Filed: Dec. 6, 2019

(65) Prior Publication Data

US 2020/0204193 A1    Jun. 25, 2020

Related U.S. Application Data

(60) Provisional application No. 62/782,528, filed on Dec. 20, 2018.

(51) Int. Cl.
*H03M 3/00* (2006.01)
*H03M 1/06* (2006.01)
*H03M 1/10* (2006.01)
*H03M 1/12* (2006.01)

(52) U.S. Cl.
CPC ......... *H03M 3/448* (2013.01); *H03M 1/0668* (2013.01); *H03M 3/414* (2013.01); *H03M 3/506* (2013.01); *H03M 1/06* (2013.01); *H03M 1/10* (2013.01); *H03M 1/12* (2013.01); *H03M 3/30* (2013.01)

(58) Field of Classification Search
CPC ............ H03M 3/30; H03M 1/06; H03M 1/12; H03M 1/10
USPC .......................... 341/143, 118, 155, 120, 126
See application file for complete search history.

(56) References Cited

U.S. PATENT DOCUMENTS

| | | | |
|---|---|---|---|
| 6,266,002 B1 | 7/2001 | Gong et al. | |
| 7,187,313 B1 * | 3/2007 | Yuan | H03L 7/1976 341/143 |
| 7,362,250 B2 | 4/2008 | Weibiao et al. | |
| 7,777,657 B2 | 8/2010 | Sandler et al. | |
| 8,766,836 B2 | 7/2014 | Maurino et al. | |

* cited by examiner

*Primary Examiner* — Joseph J Lauture
(74) *Attorney, Agent, or Firm* — Jackson Walker L.L.P.

(57) ABSTRACT

A delta-sigma modulator may include a loop filter having a loop filter input configured to receive an input signal and generate an intermediate signal responsive to the input signal and a near-zero asymmetric quantizer configured to quantize the intermediate signal into a quantized output signal which is fed back as an input to the loop filter such that the quantized output signal has a plurality of quantization levels, wherein the plurality of quantization levels are asymmetric to zero.

20 Claims, 3 Drawing Sheets

SUPPRESSION OF NOISE OF DELTA-SIGMA MODULATORS

RELATED APPLICATION

The present disclosure claims priority to U.S. Provisional Patent Application Ser. No. 62/782,528, filed Dec. 20, 2018, which is incorporated by reference herein in its entirety.

FIELD OF DISCLOSURE

The present disclosure relates in general to audio systems, and more particularly, to increasing noise performance in delta-sigma modulators.

BACKGROUND

Delta-sigma modulators may be used in many applications. For example, and without limitation, a digital delta-sigma modulator may be used in a pulse-width modulation (PWM) digital-to-analog converter application, wherein quantizer output codes from a quantizer of the digital delta-sigma modulator may be used to calculate a duty cycle for a PWM output signal driven to a transducer (e.g., a speaker, haptic actuator, piezoelectric actuator, etc.).

Delta-sigma modulation typically involves encoding high-precision, low-bandwidth signals into low-precision, high bandwidth signals. FIG. 1 illustrates a power spectrum of typical input and output signals for a delta-sigma modulator. An input signal to a delta-sigma modulator may be an analog signal or a high-bit-count digital signal with a bandwidth frequency $f_{BW}$, and its output is a low-bit-count digital signal or a stream of analog pulses with another bandwidth frequency $f_{OS}$ that is much larger than the bandwidth frequency $f_{BW}$. Although the output signal has higher quantization noise because of the lower bit counts or the fewer levels, a delta-sigma modulator may shape the noise so that most of the noise stays outside of the bandwidth frequency $f_{BW}$. For simplicity, the frequency range between direct current (DC) and bandwidth frequency $f_{BW}$ may be referred to as being "in-band," and the range between bandwidth frequencies $f_{BW}$ and $f_{OS}$ may be referred to as being "out-band."

A typical delta-sigma modulator may include a subtraction operator between its input and its output (e.g., a "delta" function), followed by a loop filter, and a quantizer. A delta-sigma modulator may include feedforward paths from its input, and feedback paths from its output to the loop filter. The loop filter may include one or more integration operations (e.g., a "sigma" function), either explicitly or implicitly. An example of implicit integration may be found in U.S. Pat. No. 6,266,002 (which is incorporated in its entirety by reference herein), in which a second order noise shaping may be achieved without an explicit integration existing within a loop.

When the input signal to the delta-sigma modulator is sufficiently small in magnitude (e.g., <0.1 q, where q is a quantization resolution of the input signal), noise peaks may appear on the output frequency spectrum of the delta-sigma modulator. Over the long term, these peaks move among different frequencies. As a result, as shown in FIG. 2, in-band signal-to-noise-ratio and dynamic range as well as out-band noise may fluctuate over time.

Noise peaking mechanics may be understood by considering an extreme case in which the input signal is maintained at zero. In this case, due to the limitation of quantization resolution, a delta-sigma modulator may exhibit periodic nonlinear loop dynamics. The output signal of the delta-sigma modulator may also exhibit such dynamics and may have noise tones on the frequency spectrum. This periodic nonlinear behavior may be referred to as "limit cycle." Limit cycle may lead to multiple tones having frequencies that are determined by the initial states of a delta-sigma modulator.

When the input signal to the delta-sigma modulator is much smaller than q, the limit cycle tones are spread out on the spectrum and become noise peaks. Because delta-sigma states are gradually affected by the input signal, the noise peaks gradually move on the frequency spectrum, which causes the fluctuation of noise-related performance. In addition, other undesirable input signals may also cause noise peaks and fluctuation, such as those inputs that stay within a certain value or range of values or periodically jump among magnitudes close to quantization resolution q (e.g., magnitudes of 0, ±q, ±2q, etc.).

One solution for resolving delta-sigma modulator noise fluctuation is to apply dither at different locations in the delta-sigma modulator. For example, U.S. Pat. No. 8,766,836 (which is incorporated in its entirety by reference herein) proposes a dither compensation method to lower extra loop filter headroom, and U.S. Pat. No. 7,362,250 (which is incorporated in its entirety by reference herein) uses a dynamic dithering technique to achieve better linearity while reducing idle channel tone. A disadvantage of dither injection though is that the output noise floor of the delta-sigma modulator is increased when using these techniques.

Another solution that is different from applying dither is provided in U.S. Pat. No. 7,777,657 (which is incorporated in its entirety by reference herein and is hereinafter referred to as the "'657 patent"). The '657 patent discloses a method to detect limit cycles or approximate limit cycles, and breaks such limit cycles whenever they are detected. However, a limitation may exist on the period of detectable limit cycles. Moreover, noise peaks due to approximate limit cycles may be difficult to detect.

SUMMARY

In accordance with the teachings of the present disclosure, certain disadvantages and problems associated with noise performance in audio systems and other systems may be reduced or eliminated.

In accordance with embodiments of the present disclosure, a delta-sigma modulator may include a loop filter having a loop filter input configured to receive an input signal and generate an intermediate signal responsive to the input signal and a near-zero asymmetric quantizer configured to quantize the intermediate signal into a quantized output signal which is fed back as an input to the loop filter such that the quantized output signal has a plurality of quantization levels, wherein the plurality of quantization levels are asymmetric to zero.

In accordance with these and other embodiments of the present disclosure, a delta-sigma modulator may include a loop filter having a loop filter input configured to receive an input signal and generate an intermediate signal responsive to the input signal, wherein the loop filter comprises one or more integrator stages comprising a first integrator stage and a quantizer configured to quantize the intermediate signal into a quantized output signal which is fed back as an input to the loop filter such that the quantized output signal has a plurality of quantization levels. The delta-sigma modulator may further include a biasing block configured to calculate a fractional part of a state variable associated with the first integrator stage, determine if the fractional part has a desired value, and responsive to the fractional part being outside of the desired value, actively bias the state variable to cause the fractional part to have the desired value in order to cause the delta-sigma modulator to have a desired noise profile.

In accordance with these and other embodiments of the present disclosure, a method may include generating, with a loop filter, an intermediate signal responsive to an input signal to the loop filter and quantizing, with a near-zero asymmetric quantizer, the intermediate signal into a quantized output signal which is fed back as an input to the loop filter such that the quantized output signal has a plurality of quantization levels, wherein the plurality of quantization levels are asymmetric to zero.

In accordance with these and other embodiments of the present disclosure, a method may include generating, with a loop filter comprising one or more integrator stages comprising a first integrator stage, an intermediate signal responsive to an input signal to the loop filter, quantizing, with a quantizer, the intermediate signal into a quantized output signal which is fed back as an input to the loop filter such that the quantized output signal has a plurality of quantization levels, calculating a fractional part of a state variable associated with the first integrator stage, determining if the fractional part has a desired value, and responsive to the fractional part being outside of the desired value, actively biasing the state variable to cause the fractional part to have the desired value in order to cause the delta-sigma modulator to have a desired noise profile.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
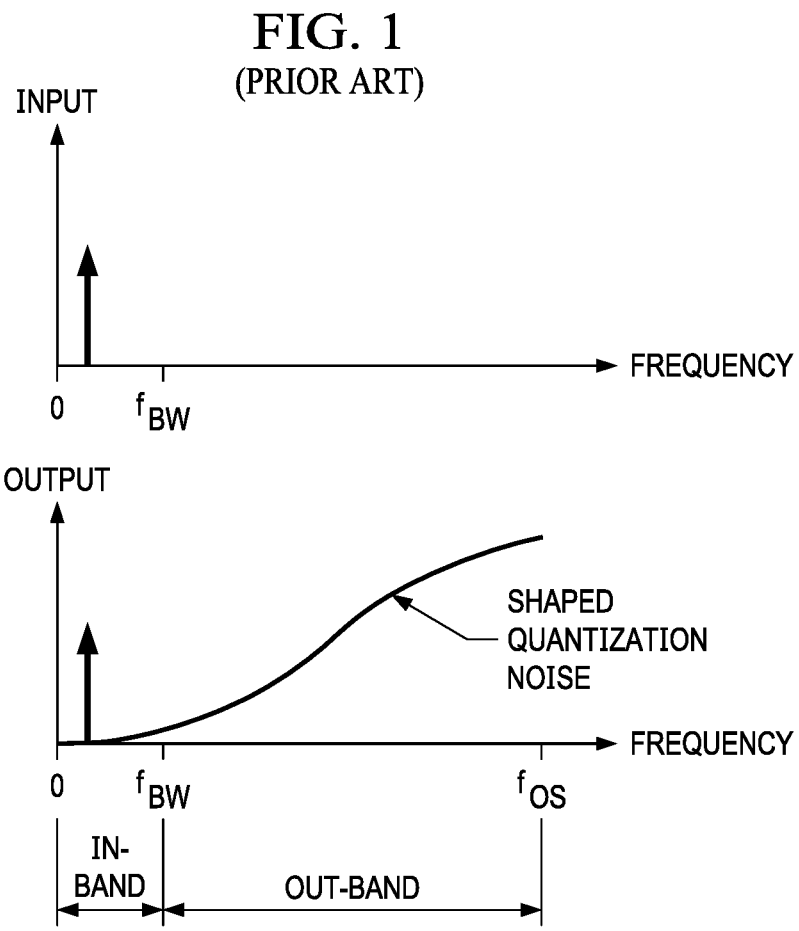
FIG. 1 illustrates graphs of power spectra of example input and output signals of a delta-sigma modulator, as is known in the art.
Figure 2:
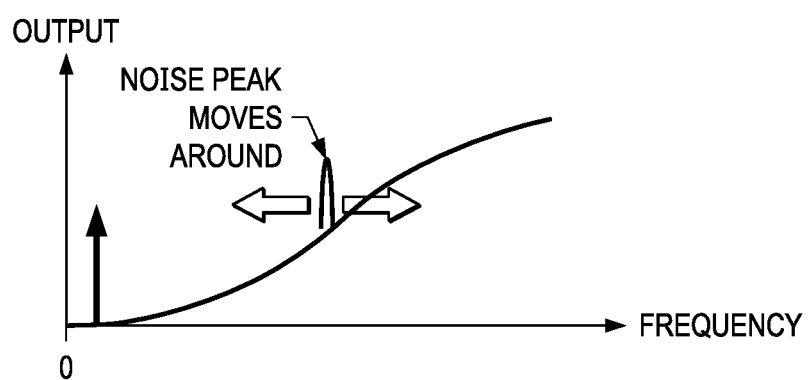
FIG. 2 illustrates a graph of a power spectrum of an example output signal of a delta-sigma modulator depicting a dynamic noise peak, as is known in the art.
Figure 3:
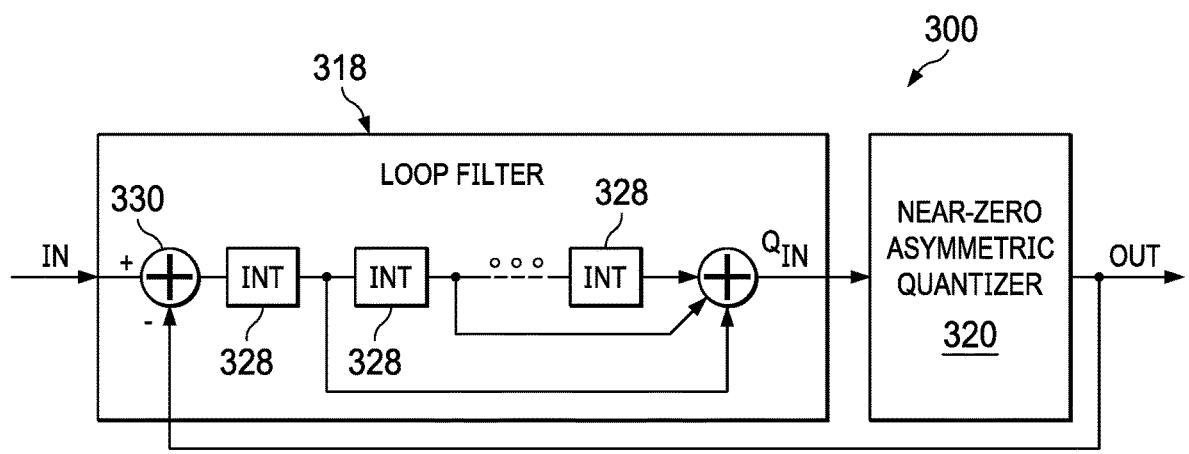
FIG. 3 illustrates a block diagram of selected components of an example delta-sigma modulator, in accordance with embodiments of the present disclosure.

FIG. 3 illustrates a block diagram of selected components of an example delta-sigma modulator 300, in accordance with embodiments of the present disclosure. Delta-sigma modulator 300 may comprise any suitable system, device, or apparatus configured to receive an input signal IN (which may be an analog signal or a digital signal) having a plurality of quantization levels each separated by a quantization resolution and modulate input signal IN to an output signal OUT (which may be an analog signal or a digital signal) which may have fewer quantization levels than input signal IN. As shown in FIG. 3, delta-sigma modulator 300 may include a loop filter 318, and a near-zero asymmetric quantizer 320.

Loop filter 318 may comprise an input summer 330 for generating an error signal equal to a difference between input signal IN and output signal OUT fed back from the output of near-zero asymmetric quantizer 320, and may also comprise one or more integrator stages 328, such that loop filter 318 operates as a filter of the error signal to generate a filtered signal $Q_{IN}$ to near-zero asymmetric quantizer 320 based on input signal IN and output signal OUT.

Near-zero asymmetric quantizer 320 may comprise any system, device, or apparatus configured to receive filtered signal $Q_{IN}$ from loop filter 318, and quantize filtered output signal $Q_{IN}$ into output signal OUT having a plurality of quantization levels (e.g., 2, 3, 4, 5, or more quantization levels, etc.) wherein the plurality of quantization levels are asymmetric to zero. For example, in some embodiments, output signal OUT may have a plurality of quantization levels, wherein each quantization level represents a change between successive samples of input signal IN. However, any suitable quantization scheme can be used. Thus, in operation, near-zero asymmetric quantizer 320 may receive filtered signal $Q_{IN}$ and based thereon, generate output signal OUT having a value selected from a set of quantization levels.

Figure 4:
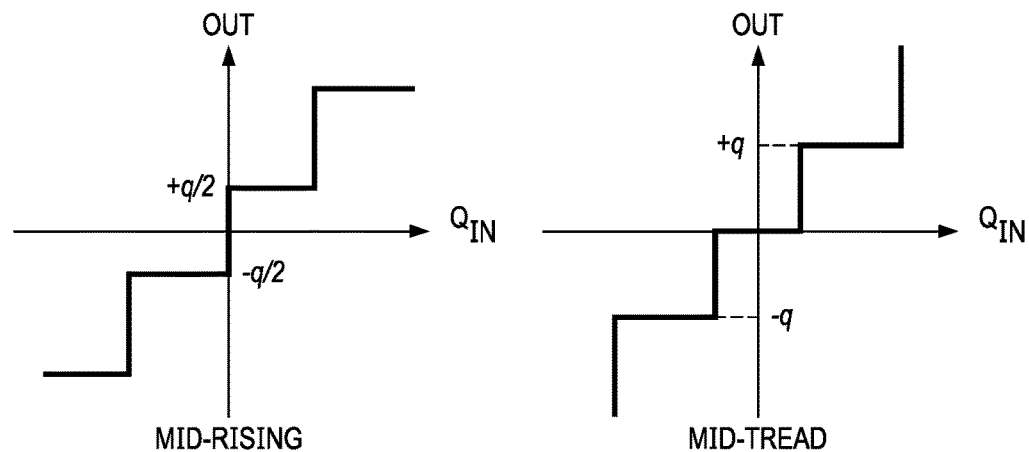
FIG. 4 illustrates example symmetric quantization schemes, in accordance with embodiments of the present disclosure.

To illustrate functionality of near-zero asymmetric quantizer 320, a discussion of symmetric quantization typically used in quantizers, as depicted in FIG. 4, may be useful. As shown in FIG. 4, two commonly used quantization schemes are mid-rising with even number of levels, and mid-tread with odd number of levels. For both schemes, the quantization levels are symmetric to zero. For example, for symmetric mid-rising quantization, output signal OUT may include an even number of quantization levels symmetric to zero (e.g., $\pm q/2$, $\pm 3q/2$, $\pm 5q/2$, etc.). As another example, for asymmetric mid-tread quantization, output signal OUT may include an even number of quantization levels symmetric to zero (e.g., 0, $\pm q$, $\pm 2q$, $\pm 3q$, etc.).

In contrast, near-zero asymmetric quantizer 320 may employ an asymmetric quantization scheme with a plurality of quantization levels asymmetric to zero. For example, near-zero asymmetric quantizer 320 may implement an asymmetric mid-rising quantization scheme having quantization levels A and B closest to zero (e.g., the absolute values of first level A and second level B are the smallest two among the absolute values of all the levels) wherein $A+B \neq 0$.

As another example, near-zero asymmetric quantizer 320 may implement an asymmetric mid-tread quantization scheme having three quantization levels A, B, and C, among which a first level A and a second level B are the two levels nearest to zero (e.g., the absolute values of first level A and second level B are the smallest two among the absolute values of all the levels), and wherein A+B≠0. Additionally, for first level A, second level B, and third level C that are the three levels nearest to zero (e.g., the absolute values of first level A, second level B, and third level C are the smallest three among the absolute values of all the levels), wherein A>B>C and A+C≠2B.

Figures 5, 6:
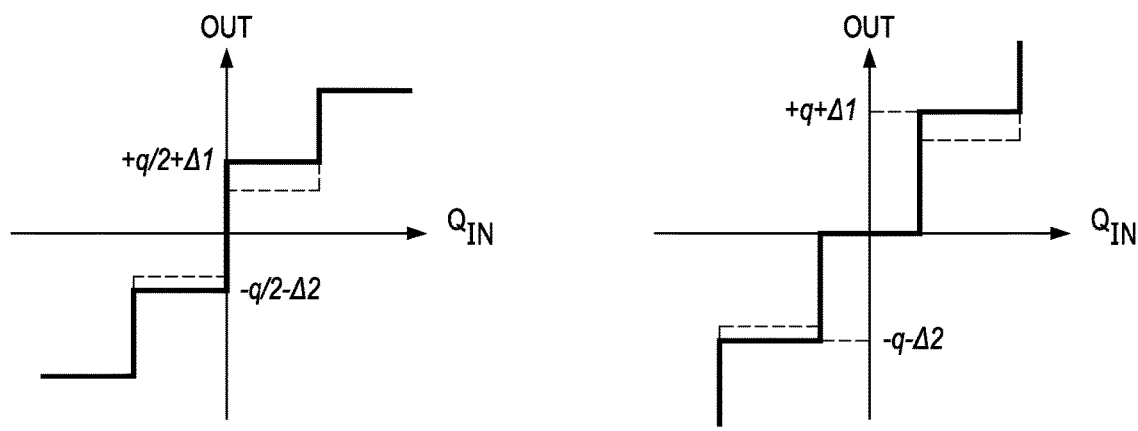
FIG. 5 illustrates an example mid-rising asymmetric quantization scheme, in accordance with embodiments of the present disclosure.
FIG. 6 illustrates an example mid-tread asymmetric quantization scheme, in accordance with embodiments of the present disclosure.

FIG. 5 illustrates an example mid-rising asymmetric quantization scheme modified from the mid-rising symmetric quantization scheme shown in FIG. 4, in which quantization levels +q/2 and −q/2 are modified to (+q/2+Δ1) and (−q/2−Δ2) respectively, wherein Δ1+Δ2≠0. By increasing a difference between Δ1 and Δ2 (e.g., maximizing |Δ1−Δ2|), periodic dynamics of delta-sigma modulator 300 may be reduced and eliminated, and thus may eliminate noise peaks and fluctuation of such noise peaks. FIG. 6 illustrates an example mid-tread asymmetric quantization scheme modified from the mid-tread symmetric quantization scheme shown in FIG. 4, in which quantization levels +q and −q are modified to (+q+M) and (−q−Δ2) respectively, wherein Δ1+0. Although FIG. 6 depicts the quantization level at zero unchanged from FIG. 4, in some embodiments, such quantization level may be assigned a non-zero value. By increasing a difference between Δ1 and Δ2 (e.g., maximizing |Δ1−Δ2|), periodic dynamics of delta-sigma modulator 300 may be reduced and eliminated, and thus may eliminate noise peaks and fluctuation of such noise peaks.

Although the examples depicted in FIGS. 5 and 6 above depict modification of only quantization levels near zero to minimize or eliminate noise fluctuation for close-to-zero input, other asymmetric quantization schemes may include modifications to other higher-magnitude levels for other undesirable input signal cases.

In embodiments in which output signal OUT is a digital signal, the encoding may be kept the same as the symmetric quantization. However, for any subsequent modules that accept output signal OUT, it may be desirable that the decoded levels match the asymmetric quantization levels of near-zero asymmetric quantizer 320.

In addition, the selection of the asymmetric level difference (e.g., |Δ1−Δ2| in the examples of FIG. 5 and FIG. 6) should be large enough to eliminate the noise peaks, while being kept as small as possible, such that the impact on other performance of delta-sigma modulator 300 is minimized.

Figure 7:
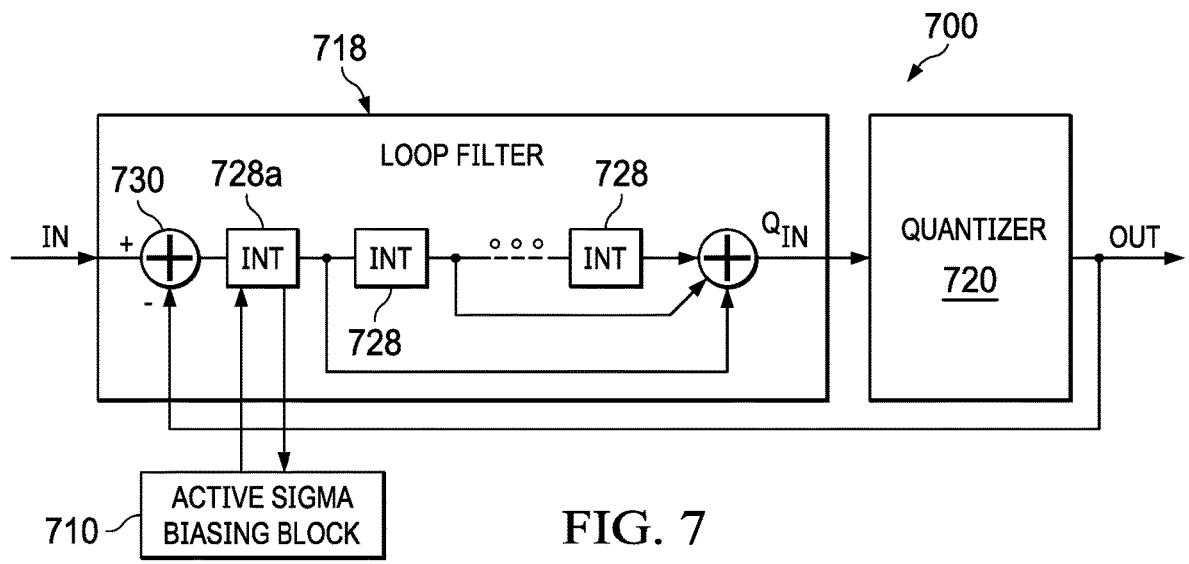
FIG. 7 illustrates a block diagram of selected components of another example delta-sigma modulator, in accordance with embodiments of the present disclosure.

FIG. 7 illustrates a block diagram of selected components of an example delta-sigma modulator 700, in accordance with embodiments of the present disclosure. Delta-sigma modulator 700 may comprise any suitable system, device, or apparatus configured to receive an input signal IN (which may be an analog signal or a digital signal) having a plurality of quantization levels each separated by a quantization resolution and modulate input signal IN to an output signal OUT (which may be an analog signal or a digital signal) which may have fewer quantization levels than input signal IN. As shown in FIG. 7, delta-sigma modulator 700 may include a loop filter 718, a quantizer 720, and an active sigma biasing block 710.

Loop filter 718 may comprise an input summer 730 for generating an error signal equal to a difference between input signal IN and output signal OUT fed back from the output of quantizer 720, and may also comprise one or more integrator stages 728, such that loop filter 718 operates as a filter of the error signal to generate a filtered signal $Q_{IN}$ to quantizer 720 based on input signal IN and output signal OUT.

Quantizer 720 may comprise any system, device, or apparatus configured to receive filtered signal $Q_{IN}$ from loop filter 718, and quantize filtered output signal $Q_{IN}$ into output signal OUT having a plurality of quantization levels (e.g., 2, 3, 4, 5, or more quantization levels, etc.). In some embodiments, output signal OUT may have a plurality of quantization levels, wherein each quantization level represents a change between successive samples of input signal IN. In these and other embodiments, quantizer 720 may employ a symmetric quantization scheme, such as those depicted in FIG. 4 and discussed above. In other embodiments, quantizer 720 may employ an asymmetric quantization scheme, such as those depicted in FIGS. 5 and 6 and discussed above. However, any suitable quantization scheme can be used. Thus, in operation, quantizer 720 may receive filtered signal $Q_{IN}$ and based thereon, generate output signal OUT having a value selected from a set of quantization levels.

Active sigma biasing block 710 may comprise any suitable system, device, or apparatus configured to bias a state of an integrator 728 (e.g., the first integrator 728a following input summer 730) to lock a fractional part of the state of such integrator 728 into a desirable state to lead to a desirable noise shape within delta-sigma modulator 700, as described in more detail below. Thus, while asymmetric quantization as discussed above may suppress noise fluctuation by removing noise peaks, active sigma biasing block 710 may operate to constrain the location of noise peaks, which may also suppress noise fluctuation, as described in more detail below.

Assuming a case in which input signal IN remains at zero, an initial state of first integrator 728a may be found to determine the distribution of noise tones. Further, an initial state of first integrator 728a may also determine a fractional value of the state of first integrator 728a over time, where the fractional value is calculated as the remainder of the state of first integrator 728a divided by the smallest positive quantization level D. For example, for a mid-rising quantizer 720 whose outputs are {±q/2, ±(3q/2), ±(5q/2), . . . }, the smallest positive quantization level D may equal one half of quantization resolution q (e.g., D=q/2). As another example, for a mid-tread quantizer 720 whose outputs are {0, ±q, ±2q, . . . }, the smallest positive quantization level D may equal quantization resolution q (e.g., D=q).

If the initial state of first integrator 728a is I and input signal IN is zero, the state of first integrator 728a may always reside within the set {nD+I, wherein n=0, ±1, ±2, . . . }. Such set is equal to {nD+F, wherein n=0, ±1, ±2, . . . }, where F is congruent to I modulo D: F=(I mod D). Because every element within {nD+F, n=0, ±1, ±2, . . . } has the same fractional value F, the state of integrator 728a may have the same fractional value F over time, in the absence of active sigma balancing.

Based on a relationship between fractional value F and a distribution of noise peaks, active sigma biasing block 710 may perform active sigma biasing to control the locations of noise peaks by actively biasing the state of first integrator 728a so that its fractional value F is within a target set.

Figure 8:
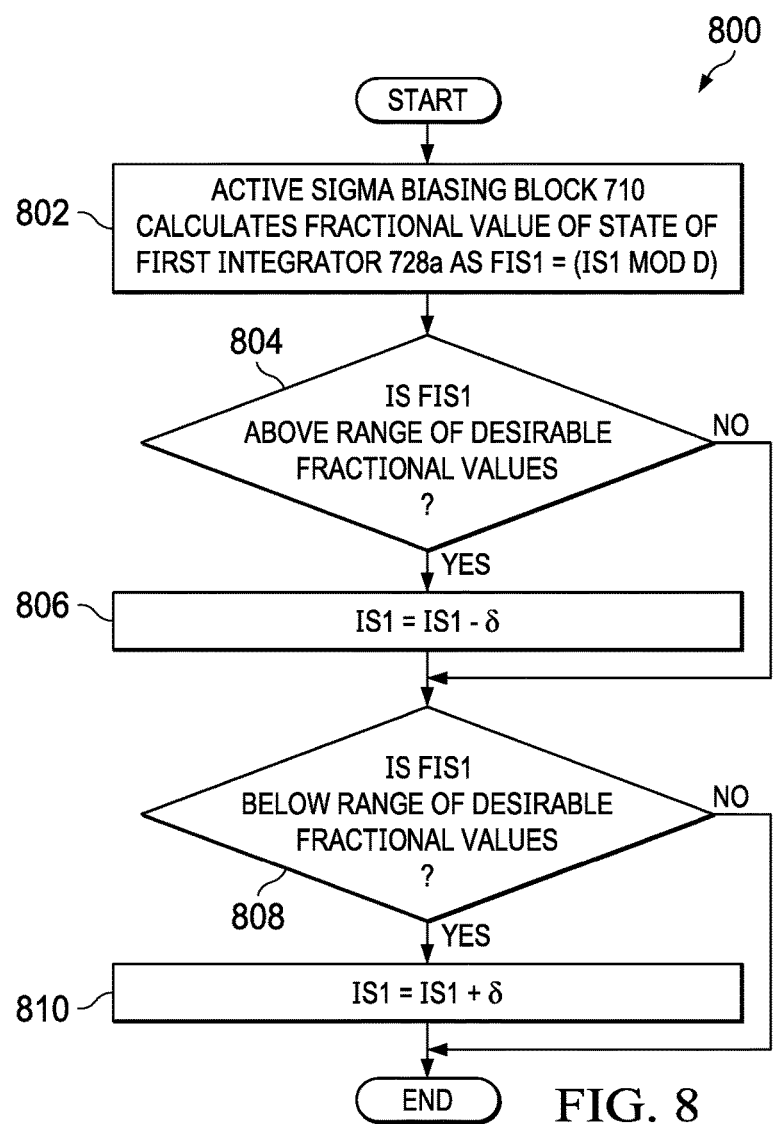
FIG. 8 illustrates a flow chart of an example method for active sigma biasing, in accordance with embodiments of the present disclosure.

FIG. 8 illustrates a flow chart of an example method 800 for active sigma biasing, in accordance with embodiments of the present disclosure. According to certain embodiments, method 800 may begin at step 802. As noted above, teachings of the present disclosure may be implemented in a variety of configurations of delta sigma modulator 800. As such, the preferred initialization point for method 800 and the order of the steps comprising method 800 may depend on the implementation chosen.

At step 802, active sigma biasing block 710 may calculate the fractional value F of the state of first integrator 728a as FIS1=(IS1 mod D), where IS1 is a state value of first integrator 728a and FIS1 is its fractional part.

At step 804, active sigma biasing block 710 may determine if fractional part FIS1 is above a range of desirable fractional values. If fractional part FIS1 is above the range of desirable fractional values, method 800 may proceed to step 806. Otherwise, method 800 may proceed to step 808.

At step 806, responsive to determining that fractional part FIS1 is above the range of desirable fractional values, active sigma biasing block 710 may decrease state value IS1 by a predefined amount δ.

At step 808, active sigma biasing block 710 may determine if fractional part FIS1 is below the range of desirable fractional values. If fractional part FIS1 is below the range of desirable fractional values, method 800 may proceed to step 810. Otherwise, method 800 may end.

At step 810, responsive to determining that fractional part FIS1 is below the range of desirable fractional values, active sigma biasing block 710 may increase state value IS1 by a predefined amount δ. After completion of step 810, method 800 may end.

Although FIG. 8 discloses a particular number of steps to be taken with respect to method 800, method 800 may be executed with greater or fewer steps than those depicted in FIG. 8. In addition, although FIG. 8 discloses a certain order of steps to be taken with respect to method 800, the steps comprising method 800 may be completed in any suitable order.

Method 800 may be implemented using active sigma biasing block 710, components thereof or any other system operable to implement method 800. In certain embodiments, method 800 may be implemented partially or fully in software and/or firmware embodied in computer-readable media.

Method 800 as described above may be used for each time step of operation of active sigma biasing block.

When mid-rising quantization is used, to further cut the processing cost of modulo operation, active sigma biasing block 710 may only perform the steps of method 800 when the magnitude of state value IS1 is less than one half of the smallest positive quantization level D (e.g., when $|IS1|<D/2$). This lower cost implementation may have weaker locking strength, but such weaker locking strength may be compensated for by increasing predefined amount δ.

While the foregoing may contemplate active sigma biasing block 710 performing active sigma biasing in the discrete-domain to update state value IS1, a similar approach may be applied in embodiments in which first integrator 728a operates in a continuous-time domain.

In accordance with the foregoing, actively biasing state variables may include adding a predefined amount δ to the state value IS1 for first integrator 728a, wherein the addition of the predefined amount δ may cause the state variables of first integrator 728a to move towards another fractional value that may in turn cause delta-sigma modulator 700 to have a more desirable noise shape. The desirable noise shape may comprise a noise shape based on one or more of the following: a lowest noise in a band of interest; a flattest low frequency component; and an absence of significant fluctuation under 20 Hz.

One example advantage of active sigma biasing is that an in-band noise level may be kept low in the case of undesirable values for input signal IN, by locking noise peaks to outside the band of interest. In addition, if delta-sigma modulator 700 is followed by a low-pass filter (e.g., a decimation filter) with out-band zeros, then desirable fractional values may be chosen such that corresponding noise peaks are located at those zeros. As a result, active sigma biasing may not only minimize in-band noise, but may also minimize out-band noise after such low-pass filter.

For example, assuming output signal OUT is decimated by a factor of four and the decimation filter has zeroes at Fs/2 and Fs/4, where Fs is the output sample rate of delta-sigma modulator 700, then active sigma biasing block 710 may choose desirable fractional values such that delta-sigma modulator noise peaks are locked at Fs/2 and Fs/4. For mid-rising quantization, setting a target fractional value to zero may lock noise peaks to around Fs/4, and for mid-tread quantization, setting a target fractional value to D/2 may lock noise peaks to around Fs/2.

Although the foregoing discusses near-zero asymmetric quantizer 320 and active sigma biasing block 710 as two different solutions, in some embodiments, in order to provide for more robust noise minimization, a delta-sigma modulator may include both a near-zero asymmetric quantizer 320 and an active sigma biasing block.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A delta-sigma modulator comprising:
 a loop filter having a loop filter input configured to receive an input signal and generate an intermediate signal responsive to the input signal; and
 a near-zero asymmetric quantizer configured to quantize the intermediate signal into a quantized output signal which is fed back as an input to the loop filter such that the quantized output signal has a plurality of quantization levels, wherein the plurality of quantization levels are asymmetric to zero.

2. The delta-sigma modulator of claim 1, wherein the plurality of levels comprises a first level and a second level which are the nearest levels to zero and a value of the first level plus a value of the second level is not equal to zero.

3. The delta-sigma modulator of claim 1, wherein:
 the plurality of levels comprise a first level, a second level, and a third level which are the nearest levels to zero;
 the first level is lesser than the second level which is in turn lesser than the third level;
 a value of the first level plus a value of the second level is not equal to zero;
 the value of the second level plus a value of the third level is not equal to zero; and
 the value of the first level plus the value of the third level is not equal to two times the value of the second level.

4. A delta-sigma modulator comprising:
 a loop filter having a loop filter input configured to receive an input signal and generate an intermediate signal responsive to the input signal, wherein the loop filter comprises one or more integrator stages comprising a first integrator stage;
 a quantizer configured to quantize the intermediate signal into a quantized output signal which is fed back as an input to the loop filter such that the quantized output signal has a plurality of quantization levels; and
 a biasing block configured to:
  calculate a fractional part of a state variable associated with the first integrator stage;
  determine if the fractional part has a desired value; and
  responsive to the fractional part being outside of the desired value, actively bias the state variable to cause the fractional part to have the desired value in order to cause the delta-sigma modulator to have a desired noise profile.

5. The delta-sigma modulator of claim 4, wherein the biasing block is configured to calculate the fractional part as a remainder of an integrated value of the first integrator stage divided by a smallest positive quantization level of the quantizer.

6. The delta-sigma modulator of claim 4, wherein the biasing block is configured to actively bias the state variable by adding a predefined amount to the state variable to cause the state variable to have a fractional part closer to or within the desired value.

7. The delta-sigma modulator of claim 4, wherein the desired noise profile comprises at least one of:
 a lowest noise in a band of interest;
 a flattest low-frequency component; and
 a lack of significant fluctuation under 20 hertz.

8. The delta-sigma modulator of claim 4, wherein the quantizer comprises a near-zero asymmetric quantizer wherein the quantized output signal has a plurality of quantization levels, and wherein the plurality of quantization levels are asymmetric to zero.

9. The delta-sigma modulator of claim 8, wherein the plurality of levels comprises a first level and a second level which are the nearest levels to zero and a value of the first level plus a value of the second level is not equal to zero.

10. The delta-sigma modulator of claim 8, wherein:
 the plurality of levels comprises a first level, a second level, and a third level which are the nearest levels to zero;
 the first level is lesser than the second level which is in turn lesser than the third level;
 a value of the first level plus a value of the second level is not equal to zero;
 the value of the second level plus a value of the third level is not equal to zero; and
 the value of the first level plus the value of the third level is not equal to two times the value of the second level.

11. A method comprising:
 generating, with a loop filter, an intermediate signal responsive to an input signal to the loop filter; and
 quantizing, with a near-zero asymmetric quantizer, the intermediate signal into a quantized output signal which is fed back as an input to the loop filter such that the quantized output signal has a plurality of quantization levels, wherein the plurality of quantization levels are asymmetric to zero.

12. The method of claim 11, wherein the plurality of levels comprises a first level and a second level which are the nearest levels to zero and a value of the first level plus a value of the second level is not equal to zero.

13. The method of claim 11, wherein:
 the plurality of levels comprises a first level, a second level, and a third level which are the nearest levels to zero;
 the first level is lesser than the second level which is in turn lesser than the third level;
 a value of the first level plus a value of the second level is not equal to zero;
 the value of the second level plus a value of the third level is not equal to zero; and
 the value of the first level plus the value of the third level is not equal to two times the value of the second level.

14. A method comprising:
generating, with a loop filter comprising one or more integrator stages comprising a first integrator stage, an intermediate signal responsive to an input signal to the loop filter;
quantizing, with a quantizer, the intermediate signal into a quantized output signal which is fed back as an input to the loop filter such that the quantized output signal has a plurality of quantization levels;
calculating a fractional part of a state variable associated with the first integrator stage;
determining if the fractional part has a desired value; and
responsive to the fractional part being outside of the desired value, actively biasing the state variable to cause the fractional part to have the desired value in order to cause the delta-sigma modulator to have a desired noise profile.

15. The method of claim 14, further comprising calculating the fractional part as a remainder of an integrated value of the first integrator stage divided by a smallest positive quantization level of the quantizer.

16. The method of claim 14, further comprising actively biasing the state variable by adding a predefined amount to the state variable to cause the state variable to have a fractional part closer to or within the desired value.

17. The method of claim 14, wherein the desired noise profile comprises at least one of:
a lowest noise in a band of interest;
a flattest low-frequency component; and
a lack of significant fluctuation under 20 hertz.

18. The method of claim 14, wherein the quantizer comprises a near-zero asymmetric quantizer wherein the quantized output signal has a plurality of quantization levels, and wherein the plurality of quantization levels are asymmetric to zero.

19. The method of claim 18, wherein the plurality of levels comprises a first level and a second level which are the nearest levels to zero and a value of the first level plus a value of the second level is not equal to zero.

20. The method of claim 18, wherein:
the plurality of levels comprises a first level, a second level, and a third level which are the nearest levels to zero;
the first level is lesser than the second level which is in turn lesser than the third level;
a value of the first level plus a value of the second level is not equal to zero;
the value of the second level plus a value of the third level is not equal to zero; and
the value of the first level plus the value of the third level is not equal to two times the value of the second level.

\* \* \* \* \*

UNITED STATES PATENT AND TRADEMARK OFFICE
CERTIFICATE OF CORRECTION

PATENT NO. : 10,840,940 B2
APPLICATION NO. : 16/706035
DATED : November 17, 2020
INVENTOR(S) : Yin et al.

It is certified that error appears in the above-identified patent and that said Letters Patent is hereby corrected as shown below:

On the Title Page

1. Item (12), under "United States Patent", delete "YiN et al." and insert -- Yin et al. --, therefor.

2. Item (72), under "Inventors", in Column 1, Line 1, delete "Leyi YiN," and insert -- Leyi Yin, --, therefor.

In the Claims

3. In Column 10, Line 12, in Claim 6, delete "a fractional part" and insert -- the fractional part --, therefor.

4. In Column 11, Lines 23-24, in Claim 16, delete "a fractional part" and insert -- the fractional part --, therefor.

Signed and Sealed this
Twenty-second Day of November, 2022

*Katherine Kelly Vidal*

Katherine Kelly Vidal
*Director of the United States Patent and Trademark Office*